US009817751B2

(12) United States Patent
Mouler et al.

(10) Patent No.: US 9,817,751 B2
(45) Date of Patent: Nov. 14, 2017

(54) MULTI-PHASE PROGRAMMING SCHEMES FOR NONVOLATILE MEMORIES

(71) Applicant: Apple Inc., Cupertino, CA (US)

(72) Inventors: Stas Mouler, Kfar Saba (IL); Shai Ojalvo, Moshav Olesh (IL); Yoav Kasorla, Kfar Netar (IL); Eyal Gurgi, Petah-Tikva (IL)

(73) Assignee: Apple Inc., Cupertino, CA (US)

( * ) Notice: Subject to any disclaimer, the term of this patent is extended or adjusted under 35 U.S.C. 154(b) by 351 days.

(21) Appl. No.: 14/475,609

(22) Filed: Sep. 3, 2014

(65) Prior Publication Data

US 2016/0062907 A1 Mar. 3, 2016

(51) Int. Cl.
G06F 12/02 (2006.01)
G11C 7/10 (2006.01)
G11C 11/56 (2006.01)

(52) U.S. Cl.
CPC ........ G06F 12/0246 (2013.01); G11C 7/1006 (2013.01); G11C 11/5628 (2013.01); G06F 2212/1024 (2013.01); G06F 2212/1032 (2013.01); G06F 2212/7202 (2013.01); G06F 2212/7206 (2013.01); G11C 2211/5641 (2013.01)

(58) Field of Classification Search
CPC .................................................. G06F 12/0246
See application file for complete search history.

(56) References Cited

U.S. PATENT DOCUMENTS

| 7,310,255 B2* | 12/2007 | Chan ........................ G11C 8/08 365/185.03 |
| 8,174,857 B1* | 5/2012 | Sommer ............. G11C 11/5642 365/185.03 |
| 8,174,895 B2* | 5/2012 | Chen .................... G11C 11/5628 365/185.03 |
| 8,321,625 B2* | 11/2012 | Weingarten ......... G06F 12/0246 711/103 |
| 8,327,246 B2* | 12/2012 | Weingarten ......... G06F 11/1072 714/790 |
| 8,335,977 B2* | 12/2012 | Weingarten ......... G06F 11/1068 714/794 |
| 8,417,876 B2* | 4/2013 | Gorobets ............ G06F 12/0246 711/103 |
| 8,467,249 B2* | 6/2013 | Katz ...................... G11C 16/26 365/185.02 |
| 8,508,995 B2* | 8/2013 | Weingarten ......... G11C 11/5628 365/185.09 |
| 8,516,274 B2* | 8/2013 | Weingarten ......... G06F 12/1408 365/185.03 |

(Continued)

Primary Examiner — Edward Dudek, Jr.
(74) Attorney, Agent, or Firm — Meyertons, Hood, Kivlin, Kowert & Goetzel, P.C.

(57) ABSTRACT

A method for data storage includes defining an end-to-end mapping between data bits to be stored in a memory device that includes multiple memory cells and predefined programming levels. The data bits are mapped into mapped bits, so that the number of the mapped bits is smaller than the number of the data bits. The data bits are stored in the memory device by programming the mapped bits in the memory cells using a programming scheme that guarantees the end-to-end mapping. After storing the data bits, the data bits are read from the memory device in accordance with the end-to-end mapping.

14 Claims, 4 Drawing Sheets

(56) References Cited

U.S. PATENT DOCUMENTS

| | | | |
|---|---|---|---|
| 8,588,003 B1* | 11/2013 | Weingarten | G11C 11/5628 365/185.02 |
| 8,607,124 B2* | 12/2013 | Weingarten | G06F 11/1048 365/185.09 |
| 8,650,352 B2* | 2/2014 | Weingarten | G11C 11/5642 365/185.18 |
| 8,693,258 B2* | 4/2014 | Weingarten | G11C 11/5628 365/185.2 |
| 8,694,715 B2* | 4/2014 | Weingarten | G11C 11/5628 365/185.03 |
| 8,694,853 B1* | 4/2014 | Sommer | G11C 11/5642 714/763 |
| 8,724,387 B2* | 5/2014 | Steiner | G11C 11/5642 365/185.03 |
| 8,745,317 B2* | 6/2014 | Weingarten | G11C 11/5628 711/103 |
| 8,751,726 B2* | 6/2014 | Katz | G06F 12/0246 711/103 |
| 8,830,746 B2* | 9/2014 | Barkon | G11C 11/5642 365/185.03 |
| 8,879,322 B2* | 11/2014 | Marcu | G11C 16/0483 365/185.17 |
| 8,879,325 B1* | 11/2014 | Bar | G11C 29/021 365/185.11 |
| 8,885,406 B2* | 11/2014 | Hosogaya | G11C 16/10 365/185.03 |
| 8,947,941 B2* | 2/2015 | Steiner | G06F 12/0246 365/185.33 |
| 8,964,464 B2* | 2/2015 | Weingarten | G11C 11/5642 365/185.03 |
| 8,990,665 B1* | 3/2015 | Steiner | G11C 11/5642 714/769 |
| 8,995,196 B2* | 3/2015 | Huang | G11C 16/10 365/185.19 |
| 8,995,197 B1* | 3/2015 | Steiner | G06F 12/0246 365/185.19 |
| 8,996,790 B1* | 3/2015 | Segal | G06F 12/0246 711/103 |
| 8,996,793 B1* | 3/2015 | Steiner | G06F 12/0246 711/103 |
| 9,037,777 B2* | 5/2015 | Sabbag | G11C 11/5628 711/103 |
| 9,063,878 B2* | 6/2015 | Sabbag | G06F 11/1072 |
| 9,069,659 B1* | 6/2015 | Sabbag | G11C 11/5642 |
| 9,136,876 B1* | 9/2015 | Steiner | H03M 13/2927 |
| 9,330,767 B1* | 5/2016 | Steiner | G06F 12/0246 |
| 2005/0213393 A1* | 9/2005 | Lasser | G11C 11/5621 365/185.33 |
| 2010/0146191 A1* | 6/2010 | Katz | G06F 12/0246 711/103 |
| 2010/0146192 A1* | 6/2010 | Weingarten | G11C 11/5628 711/103 |
| 2011/0153919 A1* | 6/2011 | Sabbag | G11C 11/5628 711/103 |
| 2011/0170358 A1* | 7/2011 | Chen | G11C 11/5628 365/185.19 |
| 2011/0258370 A1* | 10/2011 | Sharon | G11C 11/5628 711/103 |
| 2013/0024605 A1* | 1/2013 | Sharon | G06F 11/1072 711/103 |
| 2013/0024748 A1* | 1/2013 | Sharon | G06F 11/1072 714/773 |
| 2013/0042051 A1* | 2/2013 | Huang | G11C 16/3436 711/103 |
| 2013/0258738 A1* | 10/2013 | Barkon | G11C 11/5642 365/45 |
| 2014/0254266 A1* | 9/2014 | Marcu | G11C 16/0483 365/185.03 |
| 2015/0201000 A1* | 7/2015 | Niesen | G06F 17/10 709/201 |

* cited by examiner

MULTI-PHASE PROGRAMMING SCHEMES FOR NONVOLATILE MEMORIES

TECHNICAL FIELD

Embodiments described herein relate generally to data storage, and particularly to methods and systems for programming nonvolatile memories using multi-phase programming schemes.

BACKGROUND

Various storage systems comprise nonvolatile memory devices whose memory cells store multiple bits per cell. In such systems, the memory cells are typically programmed by applying a multi-phase programming scheme.

SUMMARY

An embodiment provides a method including defining an end-to-end mapping between data bits to be stored in a memory device that includes multiple memory cells and predefined programming levels. The data bits are mapped into mapped bits, so that the number of the mapped bits is smaller than the number of the data bits. The data bits are stored in the memory device by programming the mapped bits in the memory cells using a programming scheme that guarantees the end-to-end mapping. After storing the data bits, the data bits are read from the memory device in accordance with the end-to-end mapping.

In some embodiments, the data bits include Least Significant Bit (LSB), Central Significant Bit (CSB) and Most Significant Bit (MSB) pages, and the end-to-end mapping includes a 2:3:2 mapping that uses two reading thresholds for reading each of the LSB and MSB pages, and three reading thresholds for reading the CSB page. In other embodiments, mapping the data bits includes mapping the LSB, CSB and MSB pages to multiple mapped pages including the mapped bits, and programming the mapped bits includes applying multiple programming phases to the multiple mapped pages. In yet other embodiments, applying the multiple programming phases includes programming in each programming phase among the multiple programming phases a number of the mapped pages that depends on the programming phase.

In an embodiment, the multiple programming phases include first, second and third programming phases, and programming the multiple mapped pages includes programming one, two, and three mapped pages in the first, second and third programming phases, respectively. In another embodiment, mapping the data bits includes mapping the LSB, CSB, and MSB data pages to multiple mapped pages including the mapped bits, so that the mapped bits correspond to the programming levels according to a 1:2:4 mapping that uses one, two and four reading thresholds to read the LSB, CSB, and MSB pages, respectively. In yet another embodiment, the programming scheme includes multiple programming phases, and programming the mapped bits includes programming one of the mapped pages in each of the programming phases.

In some embodiments, defining the end-to-end mapping includes defining first and second end-to-end mappings, and mapping the data bits includes selecting either the first or second end-to-end mapping based on a predefined criterion. In other embodiments, selecting either the first or second end-to-end mapping depends on a level of programming interference that the memory device experiences. In yet other embodiments, selecting either the first or second end-to-end mapping includes selecting a 1:2:4 end-to-end mapping at a start of life of the memory device, and switching to a 2:3:2 end-to-end mapping when the level of programming interference exceeds a predefined interference level.

There is additionally provided, in accordance with an embodiment, apparatus for data storage including a memory, which includes multiple memory cells and storage circuitry. The storage circuitry is configured to define an end-to-end mapping between data bits to be stored in the memory device and predefined programming levels, to map the data bits into mapped bits, so that the number of the mapped bits is smaller than the number of the data bits, to store the data bits in the memory device by programming the mapped bits in the memory cells using a programming scheme that guarantees the end-to-end mapping, and, after storing the data bits, to read the data bits from the memory device in accordance with the end-to-end mapping.

These and other embodiments will be more fully understood from the following detailed description of the embodiments thereof, taken together with the drawings in which:

DETAILED DESCRIPTION OF EMBODIMENTS

Overview

Figure 1:
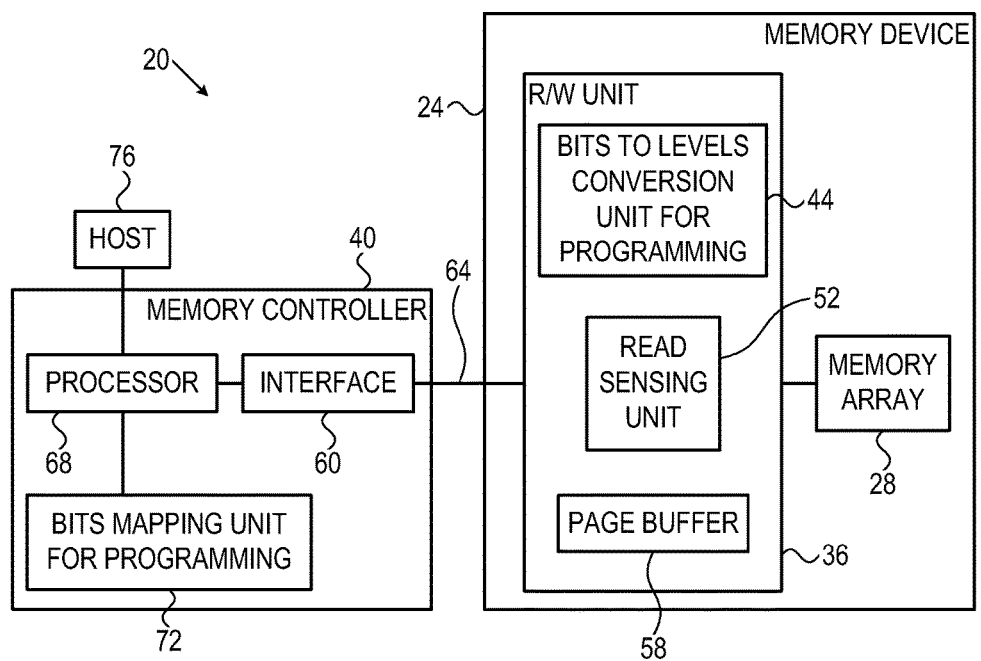
FIG. 1 is a block diagram that schematically illustrates a memory system, in accordance with an embodiment of the present invention.

Embodiments that are described herein provide improved methods and systems for programming nonvolatile memories. In some embodiments, a memory device stores multiple bits per cell, by programming each memory cell to assume a programming level that corresponds to a respective multi-bit value. The programming levels are selected from among a predefined set of programming levels. The correspondence or mapping between the data bits and the respective programming levels is also referred to herein as an end-to-end mapping.

The data bits are typically stored and retrieved in groups that are referred to as data pages. For example, for a 3 bit/cell device, the data bits are typically arranged according to the bit-significance level of the data page, such as Least Significant Bit (LSB), Central Significant Bit (CSB) and Most Significant Bit (MSB) data pages. In such embodiments, each of the programming levels corresponds to a 3-bit value that includes one bit from each of the LSB, CSB and MSB data pages, Reading a stored data page typically involves setting certain reading thresholds, and sensing the memory cells to decide to which programming levels the memory cells are set. The number of reading thresholds and their locations generally depend on the end-to-end mapping and on the bit-significance level of the page being read.

For example, an end-to-end mapping in which the LSB, CSB and MSB pages are read using one, two and four reading thresholds, respectively, is referred to herein as a 1:2:4 mapping. As another example, an end-to-end mapping in which the LSB and MSB pages are read using two reading thresholds, and the CSB page is read using three reading thresholds, is referred to herein as a 2:3:2 mapping.

The 1:2:4 and 2:3:2 mappings have different pros and cons. For example, using a 2:3:2 mapping can be advantageous over the 1:2:4 mapping with respect to page reading time. Additionally, programming schemes that achieve a 2:3:2 end-to-end mapping can be implemented using a coarse/fine programming scheme, which reduces programming interference. In contrast to the 1:2:4 mapping, using the 2:3:2 mapping typically results in a more uniform page read time over the different bit-significance pages. In addition, with the 2:3:2 mapping, the memory cells typically experience smaller programming interference.

The 1:2:4 mapping, on the other hand, is advantageous in terms of I/O transfer time between the memory controller and the memory device: When using 1:2:4 mapping, the memory controller typically transfers to the memory device only the page to be programmed. When using 2:3:2 mapping, the memory device has to transfer all three pages when programming each page, resulting in nine page transfers for programming three pages.

The programming schemes described herein enjoy the benefits of the 2:3:2 mapping relating to latency and interference and avoid the drawback of the 2:3:2 mapping relating to I/O transfer time.

In the description that follows we assume a memory system in which a memory controller stores data bits in a memory device. In the disclosed techniques, the memory controller maps the data bits to be stored into mapped bits, and sends the mapped bits to the memory device for storage. The memory device then programs the mapped bits by applying a programming scheme that guarantees the end-to-end mapping.

In an embodiment that employs a 2:3:2 mapping, the memory device implements a three-phase programming scheme in which the threshold voltage of the memory cells is distributed in two separate distributions after the first programming phase, and in eight partially overlapping distributions after the second phase. The eight intermediate programming levels are adjusted to the final programming levels in the third programming phase. Such a programming scheme is sometimes referred to as a coarse/fine programming scheme. Compared to conventional programming schemes for the 1:2:4 mapping, this programming scheme results in reduced programming interference.

In one embodiment, the memory controller delivers all three LSB, CSB and MSB data pages to the memory device in each of the three programming phases. Having all the data pages available, the memory device can implement a programming scheme that guarantees the end-to-end mapping. The programming scheme in this approach is referred to as a naïve 2:3:2 scheme. The main drawback of the naïve 2:3:2 scheme is that in order to program three data pages, the memory controller delivers a total number of nine pages to the memory device.

In an alternative embodiment, the memory controller maps the LSB, CSB and MSB data pages into one, two and three mapped pages for the respective first, second and third programming phases, respectively. This scheme is referred to as an improved 2:3:2 scheme since the memory controller delivers only six data pages to the memory device (compared to nine pages in the previous embodiment.)

In yet another alternative embodiment, the memory controller first maps the three data pages to a 1:2:4 representation, and then delivers the mapped pages to the memory device for storage. The memory device stores the mapped pages using conventional 1:2:4 programming schemes that require the delivery of only one page per programming phase. Compared to the naïve and improved 2:3:2 schemes described above, in this embodiment the memory controller delivers only three pages to the memory device. The conventional 1:2:4 programming schemes typically result in increased programming interference.

In the disclosed techniques, a 2:3:2 end-to-end mapping defines a correspondence between the data bits to be stored and respective programming levels. The data bits are first mapped into mapped bits, which are then programmed in the memory cells using a multi-phase programming scheme that guarantees the defined end-to-end mapping. The memory device can apply various programming schemes, depending on a desired performance criterion.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules (e.g., "disk-on-key" or "Flash drive" devices), Solid State Disks (SSD), digital cameras, music and other media players and/or any other system or device in which data is stored and retrieved.

System 20 comprises a memory device 24, which stores data in a memory cell array 28. The memory array comprises multiple memory cells, such as, for example, analog memory cells. In the context of the present patent application, the term "analog memory cell" is used to describe any memory cell that holds a continuous, analog value of a physical parameter, such as an electrical voltage or charge. Array 28 may comprise solid-state analog memory cells of any kind, such as, for example, NAND, NOR and Charge Trap Flash (CTF) Flash cells, phase change RAM (PRAM, also referred to as Phase Change Memory-PCM), Nitride Read Only Memory (NROM), Ferroelectric RAM (FRAM), magnetic RAM (MRAM) and/or Dynamic RAM (DRAM) cells. Although the embodiments described herein refer mainly to analog memory, the disclosed techniques may also be used with various other memory types.

The charge levels stored in the cells and/or the analog voltages or currents written into and read out of the cells are referred to herein collectively as analog values, storage values or analog storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 3 bit/cell MLC can be programmed to assume one of eight possible programming levels by writing one of eight possible nominal storage values into the cell.

In the disclosed techniques, the memory cells are typically programmed in multiple programming phases in which the memory cells are programmed to intermediate levels that may be lower than the final programming levels. In subsequent programming phases the programming levels possibly increment until reaching the final programming levels during the final programming phase. Several examples of multi-phase programming schemes are described further below.

Memory device 24 comprises a reading/writing (R/W) unit 36, which comprises a conversion unit 44, a read sensing unit 52 and a page buffer 58. Conversion unit 44 converts data for storage in the memory device to analog storage values and writes them into the memory cells. Conversion unit 44 maps bits that are temporarily stored in page buffer 58 to programming levels, wherein the mapping depends on the programming phase. For example, in some embodiments, conversion unit 44 maps a different number of bits to a respective number of programming levels depending on the programming phase. In alternative embodiments, the R/W unit does not perform the conversion, but is provided with voltage samples, i.e., with the storage values for storage in the cells.

Data is typically written to and read from the memory cells in groups that are referred to as pages. During each programming phase, device 24 receives one or more data pages from memory controller 40, and stores them in page buffer 58 prior to programming in array 28. When reading, R/W unit 36 retrieves one or more pages from memory array 28, and stores them in buffer 58 for delivery to memory controller 40.

In a 3 bit/cell device, a page-sized group of memory cells can typically store up to three data pages. In an embodiment, the data is organized in pages of respective bit-significance level, denoted Least Significant Bit (LSB), Central Significant Bit (CSB) and Most Significant Bit (MSB) pages.

When reading data out of array 28, conversion unit 44 converts the storage values of the memory cells into digital samples having an integer resolution of one or more bits. In some embodiments, reading from the memory device involves reading a full data page, and sensing unit 52 senses the memory cells by configuring certain reading thresholds whose number typically depends on the bit-significance level of the data page being read. In some embodiments, the R/W unit can erase a group of memory cells by applying one or more negative erasure pulses to the cells.

The storage and retrieval of data in and out of memory device 24 is performed by a memory controller 40. Memory controller 40 comprises an interface 60 for communicating with memory device 24 over a bus 64, a processor 68, and a bits mapping unit 72. Bits mapping unit 72 maps data bits for storage into mapped bits to be sent to memory device 24. Unit 72 can be implemented, for example, using a predefined table stored in a memory of processor 68 (not shown). Several bit mapping methods that unit 72 may use are described further below.

Note that both writing data to and reading data out of the memory should be done with respect to a given end-to-end mapping between the data bits and respective programming levels. Thus, the cascade of bits mapping by unit 72 followed by bits to levels conversion by unit 44 should result in the desired end-to-end mapping.

The disclosed techniques can be carried out by memory controller 40, by R/W unit 36, or both. Thus, in the present context, memory controller 40 and R/W unit 36 are referred to collectively as storage circuitry that carries out the disclosed techniques.

Memory controller 40 communicates with a host 76, for accepting data for storage in the memory device and for outputting data retrieved from the memory device.

Memory controller 40 may be implemented in hardware, e.g., using one or more Application-Specific Integrated Circuits (ASICs) or Field-Programmable Gate Arrays (FPGAs). Alternatively, the memory controller may comprise a microprocessor that runs suitable software, or a combination of hardware and software elements.

The configuration of FIG. 1 is an example system configuration, which is shown purely for the sake of conceptual clarity. Any other suitable memory system configuration can also be used. For example, although the example of FIG. 1 shows a single memory device, in alternative embodiments memory controller 40 may control multiple memory devices 24. Elements that are not necessary for understanding the principles of the present invention, such as various interfaces, addressing circuits, timing and sequencing circuits and debugging circuits, have been omitted from the figure for clarity.

In the example system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host. 76 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, the memory cells are arranged in multiple rows and columns, and each memory cell comprises a floating-gate transistor. The gates of the transistors in each row are connected by word lines, and the sources of the transistors in each column are connected by it lines. In the present context, the term "row" is used in the conventional sense to mean a group of memory cells that are fed by a common word line, and the term "column" means a group of memory cells fed by a common bit line. The terms "row" and "column" do not connote a certain physical orientation of the memory cells relative to the memory device. The memory array is typically divided into multiple memory pages, i.e., groups of memory cells that are programmed and read simultaneously.

In some embodiments, memory pages are sub-divided into sectors. Pages may be mapped to word lines in various manners. Each word line may store one or more pages. A given page may be stored in all the memory cells of a word line, or in a subset of the memory cells (e.g., the odd-order or even-order memory cells).

Multi-Phase Programming Schemes

Different programming schemes can be compared based on various performance criteria. For example, one performance criterion relates to the number of page transfers from the memory controller to the memory device during programming. Another performance criterion relates to page reading time, and requires a uniform (or close to uniform) reading time among pages of different bit-significance levels.

Since reading time depends mainly on the sensing time of the memory cells, the overall page reading time grows with the required number of reading thresholds, and therefore in the 2:3:2 mapping the page reading time is almost constant among the LSB, CSB and MSB pages, in contrast to the 1:2:4 mapping.

Yet another performance parameter of multi-phase programming schemes relates to the resulting programming interference. Programming interference can be created, for example, by neighboring memory cells that are already programmed, possibly to a level lower than their final programming level. Since programming schemes for the 2:3:2 end-to-end mapping are typically designed with smaller differences between respective programming levels in consecutive programming phases than in 1:2:4 mapping, the 2:3:2 mapping typically results in smaller programming interference.

In the following description we present several multi-phase programming schemes and compare their performance using the above three performance parameters.

Figure 2:
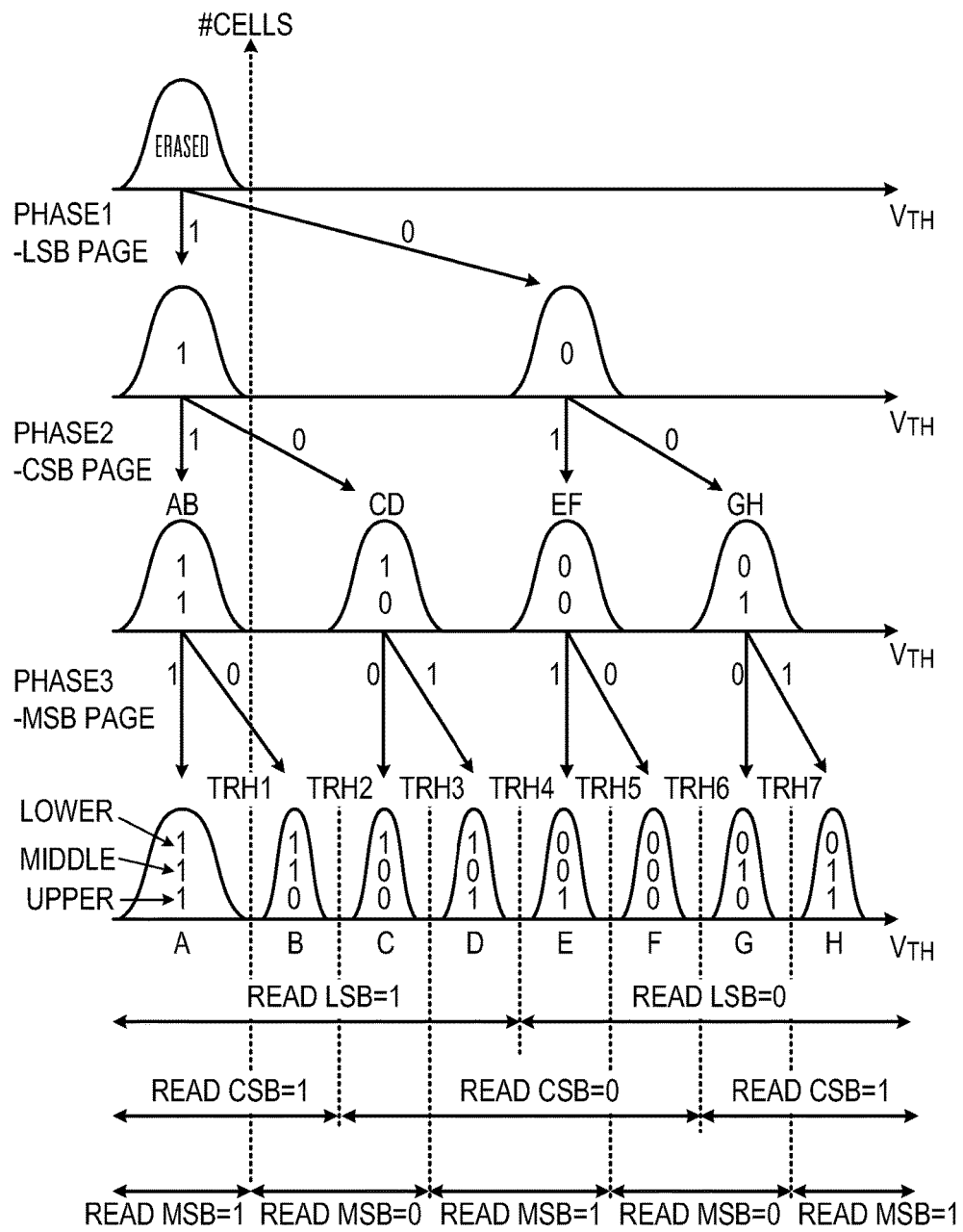
FIGS. 2 and 3 are diagrams that schematically illustrate the evolution of the threshold voltage distribution in memory cells during various multi-phase programming schemes, in accordance with embodiments of the present invention.
Figure 3:
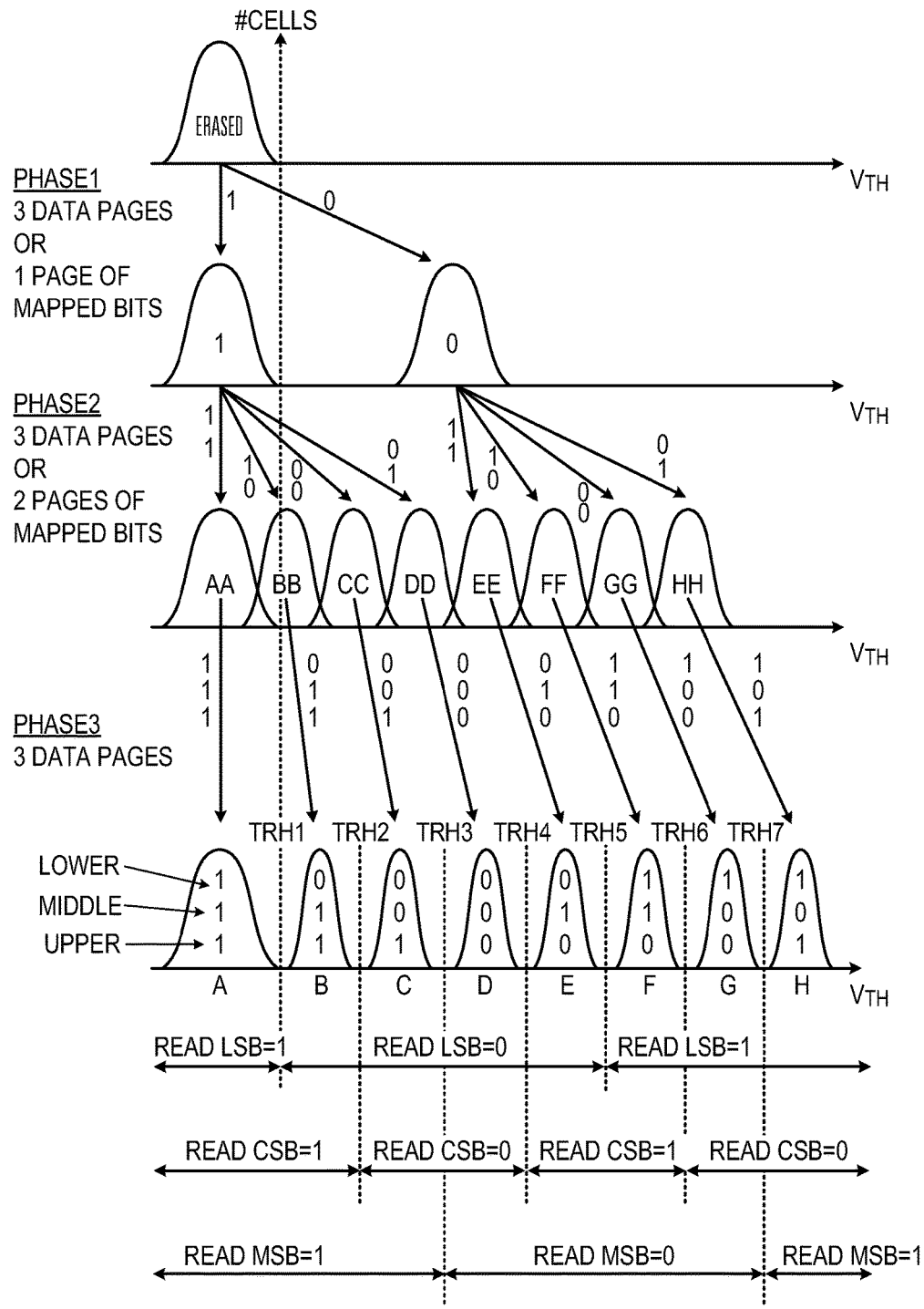

FIGS. 2 and 3 are diagrams that schematically illustrate the evolution of the threshold voltage distribution in memory cells during various multi-phase programming schemes, in accordance with an embodiment of the present invention. Both FIGS. 2 and 3 refer to an example in which memory device 24 comprises 3 bit/cell memory cells, i.e., bits to be programmed are mapped into eight programming levels denoted A . . . H. Additionally, the data for storage is arranged in data pages of three bit-significance levels, denoted LSB, CSB and MSB pages. Each of the multi-phase programming schemes that are described below comprises three programming phases. FIGS. 2 and 3 also depict seven reading thresholds, denoted TRH1 . . . TRH7, which are located between adjacent programming levels among the levels A . . . F.

In the example of FIG. 2, the end-to-end mapping corresponds to a reading scheme by which reading the LSB, CSB and MSB pages requires setting one, two and four reading thresholds, respectively. Such an end-to-end mapping is also referred to as a 1:2:4 mapping. Table 1 depicts an example 1:2:4 mapping.

TABLE 1

A 1:2:4 end-to-end bits to levels mapping.

| Page | Level | | | | | | | |
|------|---|---|---|---|---|---|---|---|
|  | A | B | C | D | E | F | G | H |
| LSB | 1 | 1 | 1 | 1 | 0 | 0 | 0 | 0 |
| CSB | 1 | 1 | 0 | 0 | 0 | 0 | 1 | 1 |
| MSB | 1 | 0 | 0 | 1 | 1 | 0 | 0 | 1 |

The example FIG. 2 refers to a three-phase programming scheme in which memory controller 40 delivers a single page per programming phase to memory device 24. In the upper part of FIG. 2, the memory device is assumed to be erased and therefore the threshold voltage distribution of the memory cells comprises only an erased level, in the present example a negative voltage level.

We now describe each of the programming phases in FIG. 2. In programming phase #1, the memory controller sends an LSB page to the memory device, which temporarily stores the page in page buffer 58. After R/W unit writes the content of the LSB page in a respective group of memory cells, the threshold voltage distribution among these memory cells comprises two separate distributions, corresponding to an LSB bit '1' and '0', respectively.

In phase #2, the memory controller sends a CSB page to the memory device, which stores the page in page buffer 58. Sensing unit 52 then senses the group of memory cells programmed in phase #1 to recover the already stored LSB page bits. R/W unit 36 then writes the CSB page so that cells programmed in phase #1 to '1' are set to one of the levels denoted AB and CD in the figure, and cells programmed in phase #1 to '0' are set to one of the levels denoted EF and GH, depending on the respective CSB page bits. Programming phase #2 thus results in four programming levels.

In programming phase #3, the memory device stores in buffer 58 a MSB page received from the memory controller. Sensing unit 52 then senses the group of cells to identify which cells were programmed in phase #2 to each of the programming levels AB, CD, EF and GH. Depending on the MSB bits, the R/W unit programs the cells that were programmed in phase #2 to level AB to a respective final programming level A or B. Similarly, cells programmed to level CD, EF, or GH in phase #2 are programmed in phase #3 to one of the respective levels C and D, B and F, or G and H.

To read back each of the LSB, CSB and MSB pages, sensing unit 52 configures certain reading thresholds and senses the group of programmed cells using. For example, setting TRH4 is sufficient for distinguishing between memory cells that are programmed to one of the levels A . . . D, for which LSB='1', or to one of the levels E . . . H, for which LSB='0'. Table 2 below summarizes the reading thresholds configurations for the 1:2:4 end-to-end mapping.

TABLE 2

Reading thresholds for a 1:2:4 mapping

|  | NUMBER OF READ THRESHOLDS | READ THRESHOLDS |
|---|---|---|
| READ LSB PAGE | 1 | TRH4 |
| READ CSB PAGE | 2 | TRH2, TRH6 |
| READ MSB PAGE | 4 | TRH1, TRH3, TRH5, TRH7 |

The example of FIG. 3 refers to a programming scheme in which the end-to-end mapping of data bits to programming levels corresponds to reading the LSB and MSB pages by setting two reading thresholds, and the CSB page by setting three reading thresholds. This end-end mapping is also referred to as a 2:3:2 mapping. Table 3 depicts an example of a 2:3:2 mapping.

TABLE 3

A 2:3:2 end-to-end bits to levels mapping.

| Page | Level | | | | | | | |
|------|---|---|---|---|---|---|---|---|
|  | A | B | C | D | E | F | G | H |
| LSB | 1 | 0 | 0 | 0 | 0 | 1 | 1 | 1 |
| CSB | 1 | 1 | 0 | 0 | 1 | 1 | 0 | 0 |
| MSB | 1 | 1 | 1 | 0 | 0 | 0 | 0 | 1 |

Table 4 summarized the reading thresholds configurations for 2:3:2 end-to-end mapping of Table 3.

TABLE 4

Reading thresholds used in 2:3:2 mapping

| | NUMBER OF READ THRESHOLDS | READ THRESHOLDS |
|---|---|---|
| READ LSB PAGE | 2 | TRH1, TRH5 |
| READ CSB PAGE | 3 | TRH2, TRH4, TRH6 |
| READ MSB PAGE | 2 | TRH3, TRH7 |

In one embodiment, memory controller 40 delivers all three data pages, namely the LSB, CSB and MSB data pages to memory device 24, in each of the programming phases. The programming scheme in this embodiment is referred to as a naïve 2:3:2 scheme. Since memory device 24 has all the three data pages available in page buffer 58 in each of the programming phases, conversion unit 44 can map the data bits to respective (possibly not fully separated) programming levels of the current programming phase so as to guarantee the desired 2:3:2 end-to-end mapping in the final programming phase.

For example, to create programming level F that corresponds to data bits '110'(in LSB, CSB, MSB order) the memory controller maps '110' to level '0' in phase #1, to level FF ('00') in phase #2, and to the final programming level F ('110') in phase #3. The main drawback of the naï2:3:2 scheme is that memory controller 40 delivers three pages per programming phase (i.e., a total of nine pages), as opposed to only one page per programming phase in the 1:2:4 scheme described above.

In an alternative embodiment, memory controller 40 maps the LSB, CSB and MSB data pages to one, two, and three pages of mapped bits for the first, second, and third programming phases, respectively. This programming scheme is referred to as an improved 2:3:2 scheme, since it requires only six page transfers, compared to nine page transfers in the naïve 2:3:2 scheme. Table 5 below depicts an example mapping of the LSE, CSB and MSB pages (per programming phase), which results in the 2:3:2 end-to-end mapping of Table 3 above.

TABLE 5

Example of bits mapping in each programming phase resulting in 2:3:3 end-to-end mapping.

| | Level | | | | | | | |
|---|---|---|---|---|---|---|---|---|
| Page | A | B | C | D | E | F | G | H |
| Data Bits | | | | | | | | |
| LSB | 1 | 0 | 0 | 0 | 0 | 1 | 1 | 1 |
| CSB | 1 | 1 | 0 | 0 | 1 | 1 | 0 | 0 |
| MSB | 1 | 1 | 1 | 0 | 0 | 0 | 0 | 1 |
| Mapped Bits | | | | | | | | |
| Phase#1 | 1 | 1 | 1 | 1 | 0 | 0 | 0 | 0 |
| Phase#2 | 11 | 10 | 00 | 01 | 11 | 10 | 00 | 01 |
| Phase#3 | 111 | 011 | 001 | 000 | 010 | 110 | 100 | 101 |

Similarly to FIG. 2, in the upper part of FIG. 3, the memory device is assumed to be erased, and the threshold voltage distribution comprises only the erased level. After completing the first programming phase, the threshold voltage distribution comprises two separate distributions corresponding to A . . . D and E . . . H programming levels, respectively. After the second programming phase, the threshold voltage comprises eight distributions that are not fully separated from one another. As a result, sensing the memory cells to identify their respective programming levels is typically impossible.

In the third programming phase, all the three data pages are available, and the memory device can identify the memory cells that were programmed to each of the eight AA . . . HH intermediate levels in the second phase, and program these memory cells to respective final programming levels A . . . H. For example, when the input in phase #3 is '000' the memory controller identifies the memory cells that were programmed to '1' and '01' in the first and second phases, respectively, and programs the identified cells to level D.

Note that in programming phase #2 of FIG. 3, there are eight partially overlapping levels. In phase #2 of FIG. 2, on the other hand, there are only four levels, which are fully separated. As a result, programming schemes employing a 2:3:2 mapping typically result in lower programming interference compared to 1:2:4 mapping.

As explained above, the 1:2:4 end-to-end mapping requires only three page transfers compared to at least six in the 2:3:2 end-to-end mapping. In some embodiments that employ 2:3:2 end-to-end mapping, the data bits are first mapped to a 1:2:4 representation. The memory controller then programs the mapped bits using a conventional 1:2:4 programming scheme that requires only three page transfers. Table 6 depicts the mapping from 2:3:2 to 1:2:4 representation for the eight programming levels A . . . H.

TABLE 6

Mapping from 2:3:2 to 1:2:4 representation

| Programming level | 2:3:2 mapping LSB, CSB, MSB | 1:2:4 mapping LSB, CSB, MSB |
|---|---|---|
| A | 1, 1, 1 | 1, 1, 1 |
| B | 0, 1, 1 | 1, 1, 0 |
| C | 0, 0, 1 | 1, 0, 0 |
| D | 0, 00 | 1, 0, 1 |
| E | 0, 1, 0 | 0, 0, 1 |
| F | 1, 1, 0 | 0, 0, 0 |
| G | 1, 0, 0 | 0, 1, 0 |
| H | 1, 0, 1 | 0, 1, 1 |

The memory controller delivers one of the pages mapped to 1:2:4 representation in each programming phase (instead of one, two and three phases in the 2:3:2 improved scheme) to the memory device.

The memory device programs the mapped pages, for example, according to the programming scheme of FIG. 2 above. Since the last scheme combines both 1:2:4 and 2:3:3 mappings this scheme is also referred to as a combined scheme. The drawback of the combined scheme is that it results in high programming interference because of the 1:2:4 programming scheme. Note that since the combined scheme results in 2:3:2 end-to-end mapping, it requires a reading scheme as depicted in Table 4 above.

In Table 7, the programming schemes described above are compared according to three different performance criteria.

TABLE 7

Comparison among several programming scheme

| Performance criterion/ programming scheme | #Page transfers | #Read thresholds | Programming interference level |
|---|---|---|---|
| 1:2:4 | 3 | NON-UNIFORM | HIGH |
| 2:3:2 Naïve | 9 | UNIFORM | LOW |

TABLE 7-continued

Comparison among several programming scheme

| Performance criterion/ programming scheme | #Page transfers | #Read thresholds | Programming interference level |
|---|---|---|---|
| 2:3:2 Improved | 6 | UNIFORM | LOW |
| Combined | 3 | UNIFORM | HIGH |

Figure 4:
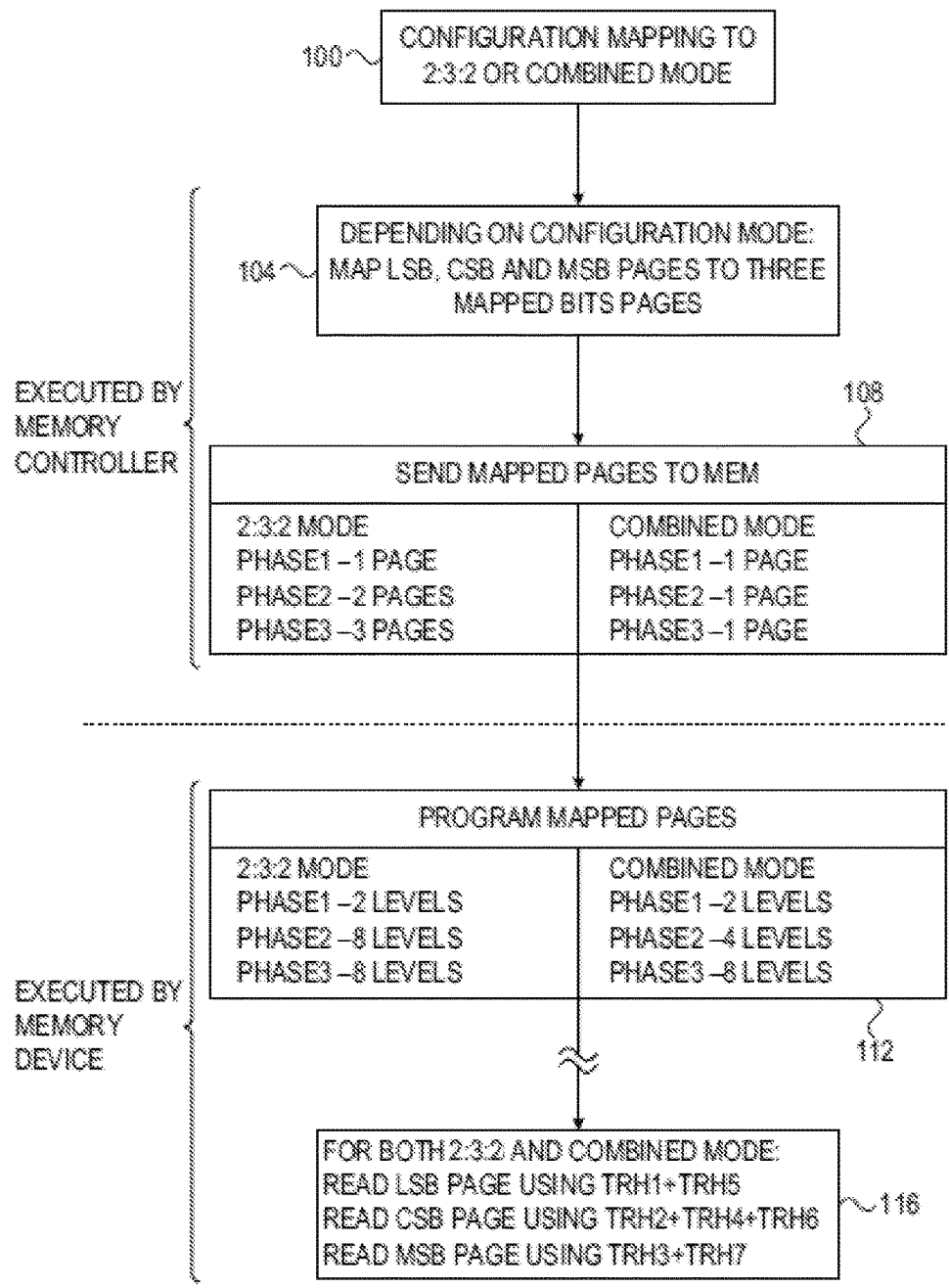
FIG. 4 is a flow chart that schematically illustrates a method for programming a memory device, in accordance with an embodiment of the present invention.

FIG. 4 is a flow chart that schematically illustrates a method for programming a memory device, in accordance with an embodiment of the present invention. The method begins at a configuration step 100, in which the memory controller selects a 2:3:2 or combined mapping mode.

In a mapping step 104, the memory controller maps input LSB, CSB and MSB data pages into one or more mapped pages. If configured to the 2:3:2 mapping, bits mapping unit 72 maps the LSB, CSB and MSB data pages in each programming phase according, for example, to the mapping depicted in Table 5 above. Otherwise, the selected configuration is the combined mapping mode, and bits mapping unit 72 maps the LSB, CSB and MSB pages to 1:2:4 representation according to Table 6 above.

At a sending step 108, the memory controller delivers the mapped pages of step 104 to memory device 24. In the 1:2:3 and combined modes, the memory controller delivers a total number of six or three pages, respectively. The memory device receives the mapped pages and stores them temporarily in page buffer 58. At a programming step 112, the memory device writes the mapped pages in array 28. The memory device applies a suitable programming scheme depending on the end-to-end mapping configuration and on the current programming phase. For example, in an embodiment, the memory device applies one the programming schemes described in FIGS. 2 and 3 above, respectively.

After applying the final (third in the present example) programming phase, the memory controller may read any of the LSB, CSB and MSB pages as required. At a reading phase 116, the memory device reads the LSE, CSB and MSB pages using reading thresholds as given in Table 4 above, Note that since both the 2:3:2 and combined modes result in 2:3:2 end-to-end mapping, they share a common reading phase. Following step 116 the method terminates.

The configurations in the methods described above are exemplary configurations and other suitable configurations can also be used. For example, Tables 1 and 3 above depict example 1:2:4 and 2:3:2 end-to-end mappings, in which 3-bit combinations corresponding to adjacent programming levels differ in only one bit. Since most reading errors occur when falsely detecting that a cell is programmed to a level adjacent to the true level, such mappings ensure that such events result in no more than a single bit error. In alternative embodiments, other 1:2:4 and 2:3:2 mappings can be used.

The programming schemes presented in FIGS. 2 and 3 are exemplary, and in alternative embodiments, other programming schemes can also be used. For example, programming levels whose number and positions are different from those depicted in the figures are also applicable. As an example, in FIG. 2 the threshold voltage distribution after the second phase may comprise four separate distributions (rather than two in the figure).

In some embodiments, different end-to-end mappings can be used in different situations. For example, when controlling multiple memory devices, the memory controller can used different end-to-end mapping in different devices or in different areas within a given device. For example, the memory device can select the 1:2:4 or 2:3:2 end-to-end mapping based on a trade-off among three possibly conflicting requirements—1) storage reliability, which is dominated by interference, 2) programming time, which is dominated by 10 accesses, and 3) reading time. For example, at start of life of the memory device, the storage reliability is considered to be high even in the presence of interference, and therefore the controller may choose to operate with the 1:2:4 end-to-end mapping. At a later time, when programming interference becomes a dominant factor (e.g., exceeding a predefined interference level), the controller may switch to a 2:3:2 mapping.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method for data storage, comprising:
receiving a plurality of data bits to be stored in a memory device that includes multiple memory cells;
based upon a desired page read time, selecting a particular end-to-end mapping;
mapping the plurality of data bits into a plurality of mapped bits using the particular end-to-end mapping, wherein a number of the plurality of mapped bits is less than a number of the plurality of data bits;
storing the plurality of data bits in the memory device by programming each memory cell of a subset of the multiple memory cells to a respective one of a plurality of programming levels using the plurality of mapped bits in the memory cells and a programming scheme that guarantees the particular end-to-end mapping;
after storing the plurality of data bits, reading the plurality of data bits from the memory device in accordance with the particular end-to-end mapping; and
selecting the particular end-to-end mapping based on a level of programming interference experienced by the memory device, which includes selecting a 1:2:4 end-to-end mapping that uses one, two and four reading thresholds to read each of a LSB, CSB, and MSB pages at a start of life of the memory device, and switching to a 2:3:2 end-to-end mapping that uses two reading thresholds for reading each of the LSB and MSB pages and three reading thresholds for reading the CSB page when the level of programming interference exceeds a particular interference level.

2. The method according to claim 1, wherein the plurality of data bits includes a Least Significant Bit (LSB), a Central Significant Bit (CSB) and a Most Significant Bit (MSB) pages, and wherein the particular end-to-end mapping includes a 2:3:2 mapping that uses two reading thresholds for reading each of the LSB and MSB pages, and three reading thresholds for reading the CSB page.

3. The method according to claim 2, wherein mapping the plurality of data bits includes mapping the LSB, CSB and MSB pages to multiple mapped pages included in the plurality of mapped bits, and wherein programming each memory cell of the subset of the multiple memory cells includes applying multiple programming phases to each memory cell of the subset of the multiple memory cells using the multiple mapped pages.

4. The method according to claim 3, wherein applying the multiple programming phases includes programming, in each programming phase of the multiple programming phases, each memory cell of the subset of the multiple memory cells using a number of the plurality of multiple mapped pages that depends on the programming phase.

5. The method according to claim 3, wherein the multiple programming phases include first, second and third programming phases, and wherein programming the each memory cell of the subset of the multiple memory cells includes programming the number of the subset of the multiple memory cells using one, two, and three mapped pages in the first, second and third programming phases, respectively.

6. The method according to claim 2, wherein mapping the plurality of data bits includes mapping the LSB, CSB, and MSB data pages to multiple mapped pages included in the plurality of mapped bits, so that the mapped bits correspond to the programming levels according to a 1:2:4 mapping that uses one, two and four reading thresholds to read the LSB, CSB, and MSB pages, respectively.

7. The method according to claim 6, wherein the programming scheme includes multiple programming phases, and wherein programming each memory cell of the subset of the multiple memory cells using the mapped bits includes programming each memory cell of the subset of the multiple memory cells using one of the mapped pages in each of the programming phases.

8. An apparatus for data storage, comprising:
a memory including multiple memory cells; and
storage circuitry configured to:
receive a plurality of data bits for storage;
based upon a desired page read time, select a particular end-to-end mapping;
map the plurality of data bits into a plurality of mapped bits, wherein a number of the plurality of mapped bits is less than a number of the plurality of data bits;
program each memory cell of a subset of the multiple memory cells to a respective one of a plurality of programming levels using the plurality of mapped bits and a programming scheme that guarantees the particular end-to-end mapping;
read the plurality of data bits from the memory in accordance with the particular end-to-end mapping;
select the particular end-to-end mapping based on a level of programming interference experienced by the memory; and
wherein to select the particular end-to-end mapping, the storage circuitry is further configured to select a 1:2:4 end-to-end mapping at a start of life of the memory, and select a 2:3:2 end-to-end mapping in response to a determination the level of programming interference exceeds a particular interference level.

9. The apparatus according to claim 8, wherein the plurality of data bits includes a Least Significant Bit (LSB), a Central Significant Bit (CSB) and a Most Significant Bit (MSB) pages, and wherein the particular end-to-end mapping includes a 2:3:2 mapping that uses two reading thresholds for reading each of the LSB and MSB pages, and three reading thresholds for reading the CSB page.

10. The apparatus according to claim 9, wherein to map the plurality of data bits, the storage circuitry is further configured to map the LSB, CSB and MSB pages to multiple mapped pages included in the plurality of mapped bits, and wherein to program each memory cell of the subset of the multiple memory cells, the storage circuitry is further configured to apply multiple programming phases to each memory cell using the multiple mapped pages.

11. The apparatus according to claim 10, wherein apply the multiple programming phases, the storage circuitry is further configured to program, in each programming phase included in the multiple programming phases, program each memory cell of the subset of the multiple memory cells using a number of the mapped pages that depends on the programming phase.

12. The apparatus according to claim 10, wherein the multiple programming phases include first, second and third programming phases, and wherein to program each memory cell of the subset of the multiple memory cells, the storage circuitry is further configured to program each memory cell using one, two, and three mapped pages in the first, second and third programming phases, respectively.

13. The apparatus according to claim 9, wherein to map the plurality of data bits, the storage circuitry is further configured to map the LSB, CSB, and MSB data pages to multiple mapped pages included the mapped bits, so that the mapped bits correspond to the programming levels according to a 1:2:4 mapping that uses one, two and four reading thresholds to read the LSB, CSB, and MSB pages, respectively.

14. The apparatus according to claim 13, wherein the programming scheme comprises multiple programming phases, and wherein the storage circuitry is configured to program one of the mapped pages in each of the programming phases.

* * * * *